United States Patent
Colburn et al.

(10) Patent No.: US 6,641,899 B1
(45) Date of Patent: Nov. 4, 2003

(54) NONLITHOGRAPHIC METHOD TO PRODUCE MASKS BY SELECTIVE REACTION, ARTICLES PRODUCED, AND COMPOSITION FOR SAME

(75) Inventors: Matthew E Colburn, Hopewell Junction, NY (US); Stephen M Gates, Ossining, NY (US); Jeffrey C Hedrick, Montvale, NJ (US); Elbert Huang, Tarrytown, NY (US); Satyanarayana V Nitta, Poughquag, NY (US); Sampath Purushothaman, Yorktown Heights, NY (US); Muthumanickam Sankarapandian, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/287,935

(22) Filed: Nov. 5, 2002

(51) Int. Cl.[7] .................................................. B32B 3/00
(52) U.S. Cl. ...................... 428/209; 428/210; 428/195; 427/503; 427/504; 427/510; 427/515
(58) Field of Search ................................. 427/503, 504, 427/510, 515; 428/209, 210

(56) References Cited

U.S. PATENT DOCUMENTS

| | | | | |
|---|---|---|---|---|
| 4,917,926 A | * | 4/1990 | Weinhold et al. | 428/40 |
| 5,077,085 A | * | 12/1991 | Schnur et al. | 427/98 |
| 5,569,739 A | * | 10/1996 | Adamopoulos et al. | 528/353 |
| 5,664,325 A | * | 9/1997 | Fukutomi et al. | 29/848 |
| 5,939,150 A | * | 8/1999 | Stelzle et al. | 427/558 |
| 6,156,393 A | * | 12/2000 | Polanyi et al. | 427/533 |
| 6,200,646 B1 | * | 3/2001 | Neckers et al. | 427/510 |

OTHER PUBLICATIONS

O. Prucker and J. Ruhe, "*Polymer Layers Through Self-Assembled Monolayers of Initiators*", vol. 14, No. 24, p. 6893–6898, American Chemical Society, Oct. 30, 1998.

Noo Li Jeon, Insung S. Choi, and George M, Whitesides, "*Patterned Polymer Growth on Silicon Surfaces Using microcontact Printing and Surface–Initiated Polymerization*", vol. 75, No. 26, p. 42001–4203, American Institute of Physics, Dec. 27, 1999.

\* cited by examiner

*Primary Examiner*—Cathy Lam
(74) *Attorney, Agent, or Firm*—Ohlandt, Greeley, Ruggiero & Perle, L.L.P.; Daniel P. Morris

(57) ABSTRACT

A method for forming a self aligned pattern on an existing pattern on a substrate comprising applying a coating of the masking material to the substrate; and allowing at least a portion of the masking material to preferentially attach to portions of the existing pattern. The pattern is comprised of a first set of regions of the substrate having a first atomic composition and a second set of regions of the substrate having a second atomic composition different from the first composition. The first set of regions may include one or more metal elements and the second set of regions may include a dielectric. The masking material may comprise a polymer containing a reactive grafting site that selectively binds to the portions of the pattern. The masking material may include a polymer that binds to the portions of the pattern to provide a layer of functional groups suitable for polymerization initiation, a reactive molecule having functional groups suitable for polymerization propagation, or a reactive molecule, wherein reaction of the reactive molecule with the portion of the pattern generates a layer having reactive groups, which participate in step growth polymerization. Structures in accordance with the method. Compositions for practicing the method.

11 Claims, 8 Drawing Sheets

First Method for Self Aligned Mask Generation by Polymer Reaction

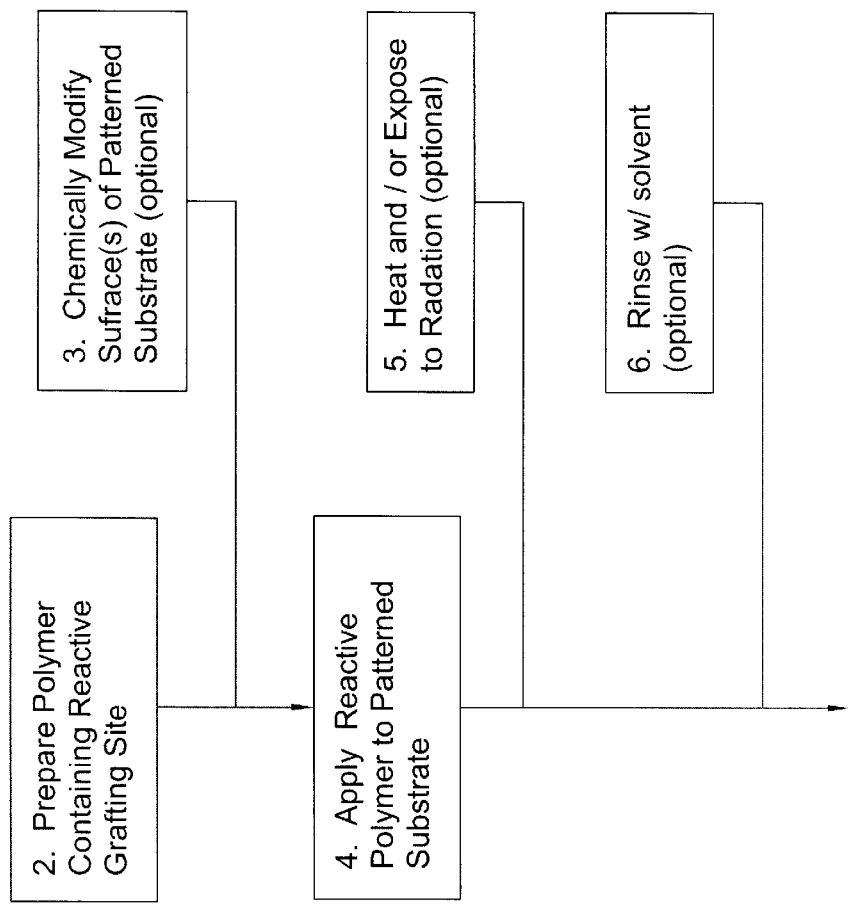
Fig. 1: General Process Flow for Self Aligned Mask Generation by Covalent Polymer Attachment

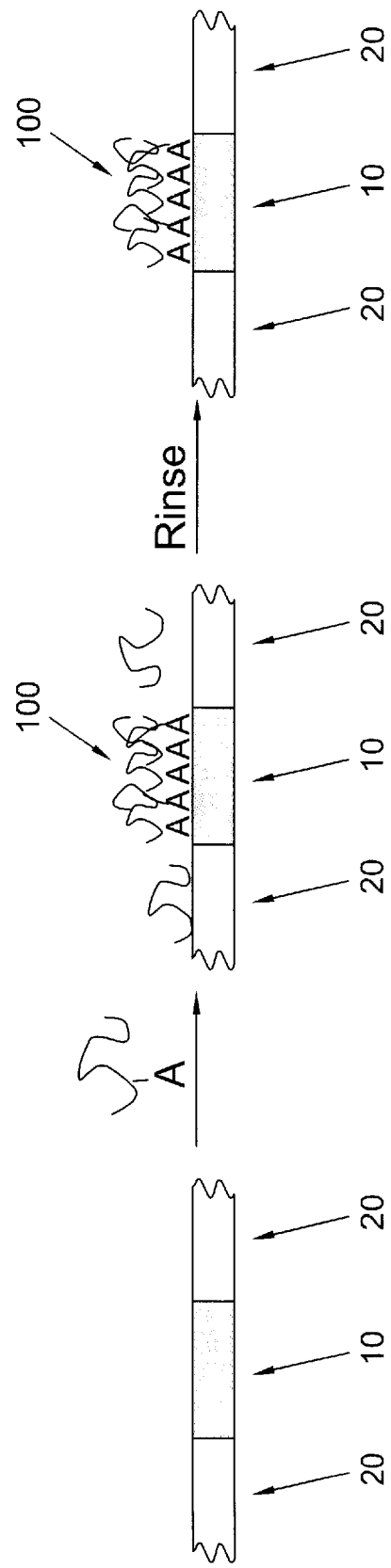
Fig. 2: First Method for Self Aligned Mask Generation by Polymer Reaction

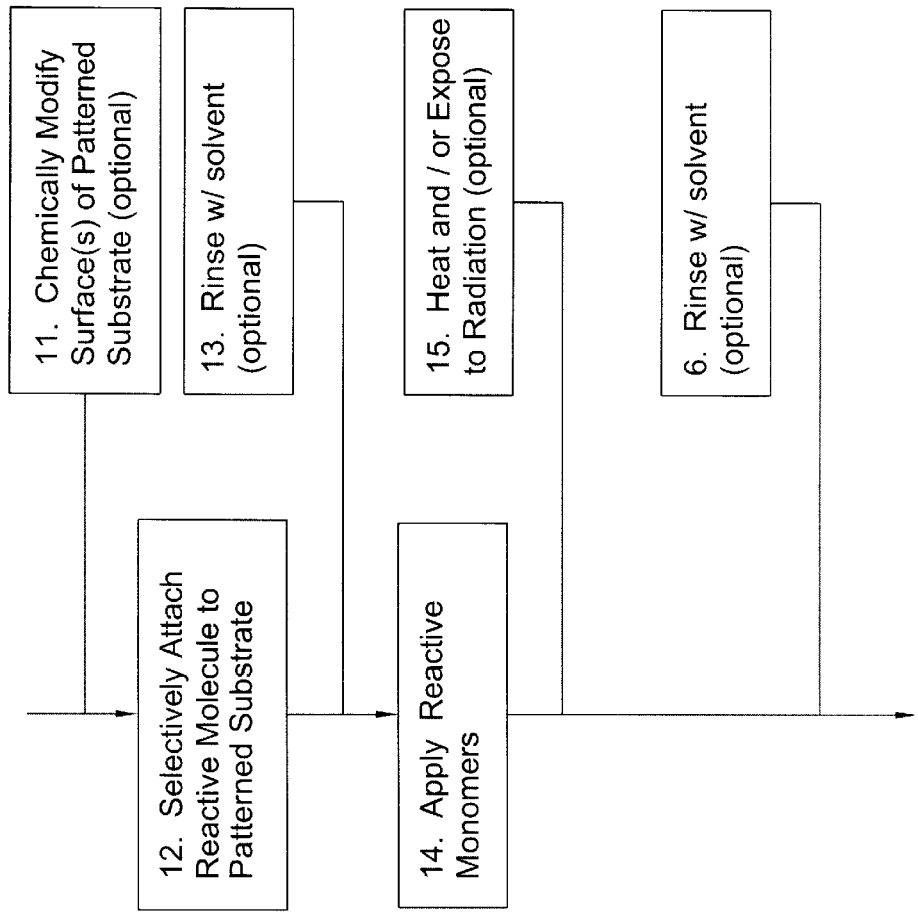
Fig. 3: General Process Flow for Self Aligned Mask Generation by Surface Polymerization

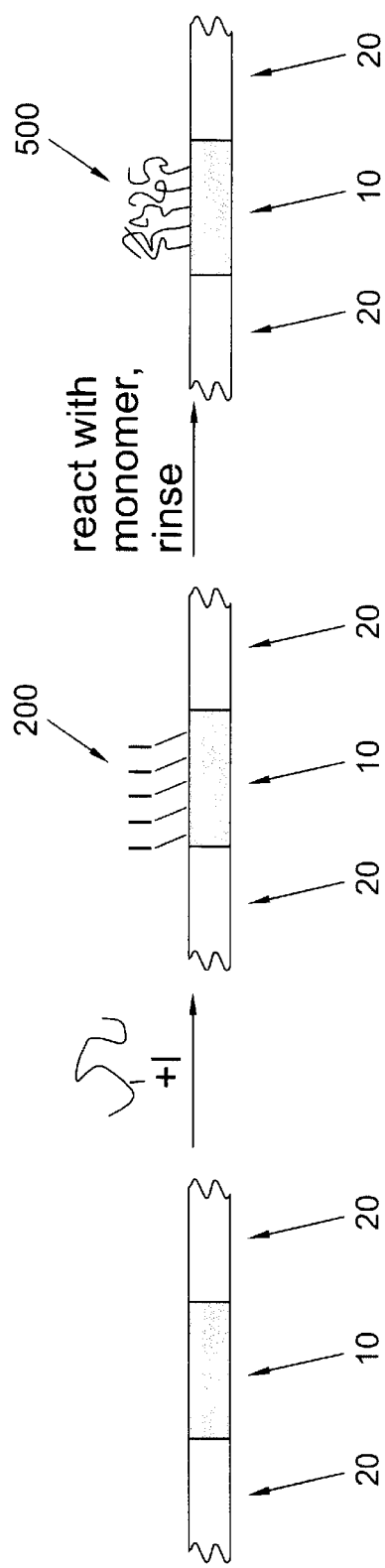
Fig. 4: Second Method for Self Aligned Mask Generation by Chain Polymerization from Surface Grafted Initiator

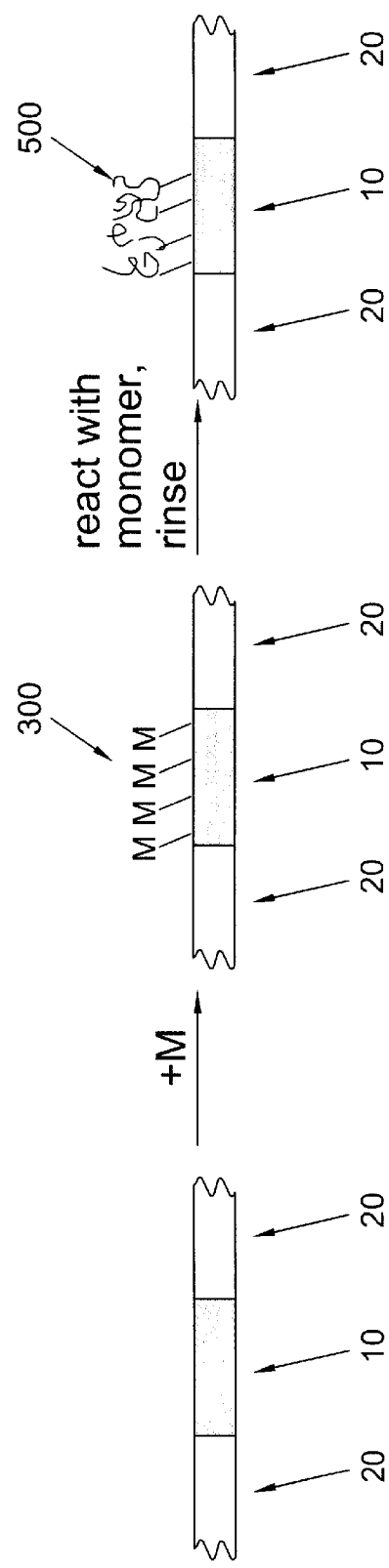
Fig. 5: Third Method for Self Aligned Mask Generation by Chain Polymerization from Surface Grafted Monomer

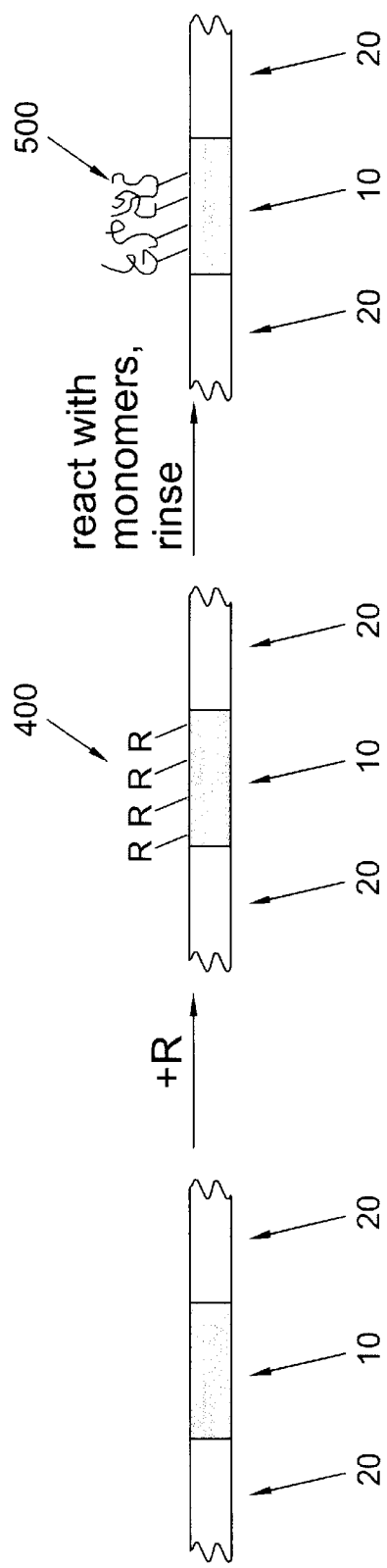
Fig. 6: Fourth Method for Self Aligned Mask Generation by Step Polymerization from Surface Grafted Reactive Site

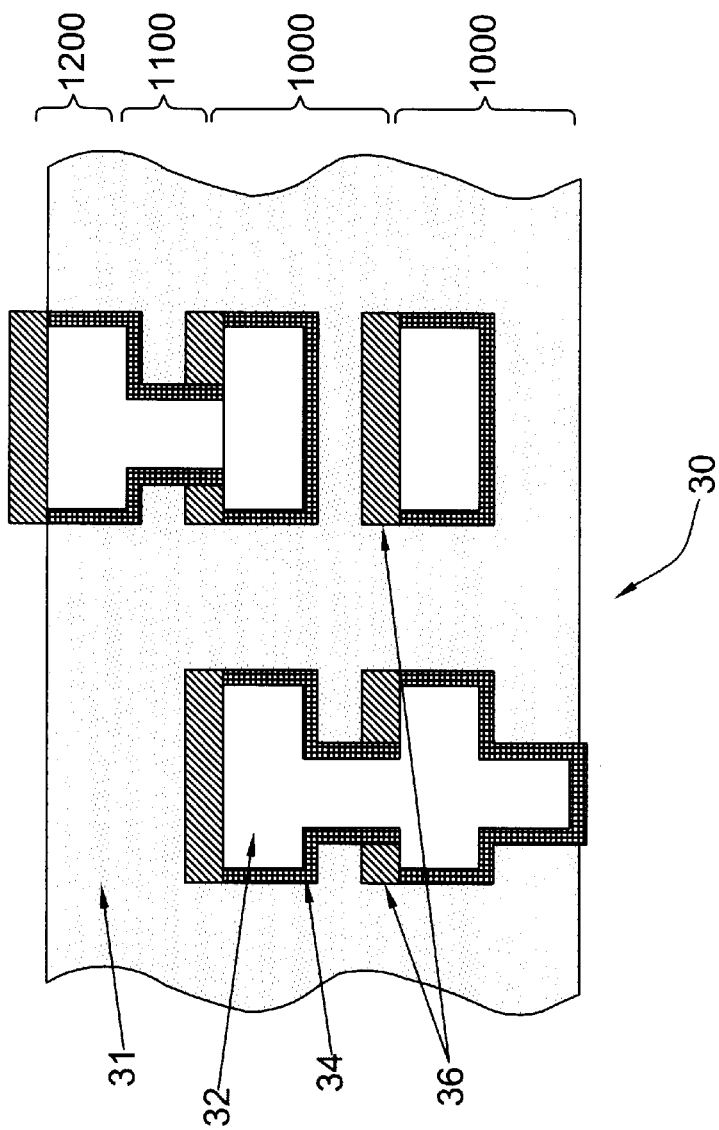
Fig. 7: Cross Sectional View of Semiconductor Device

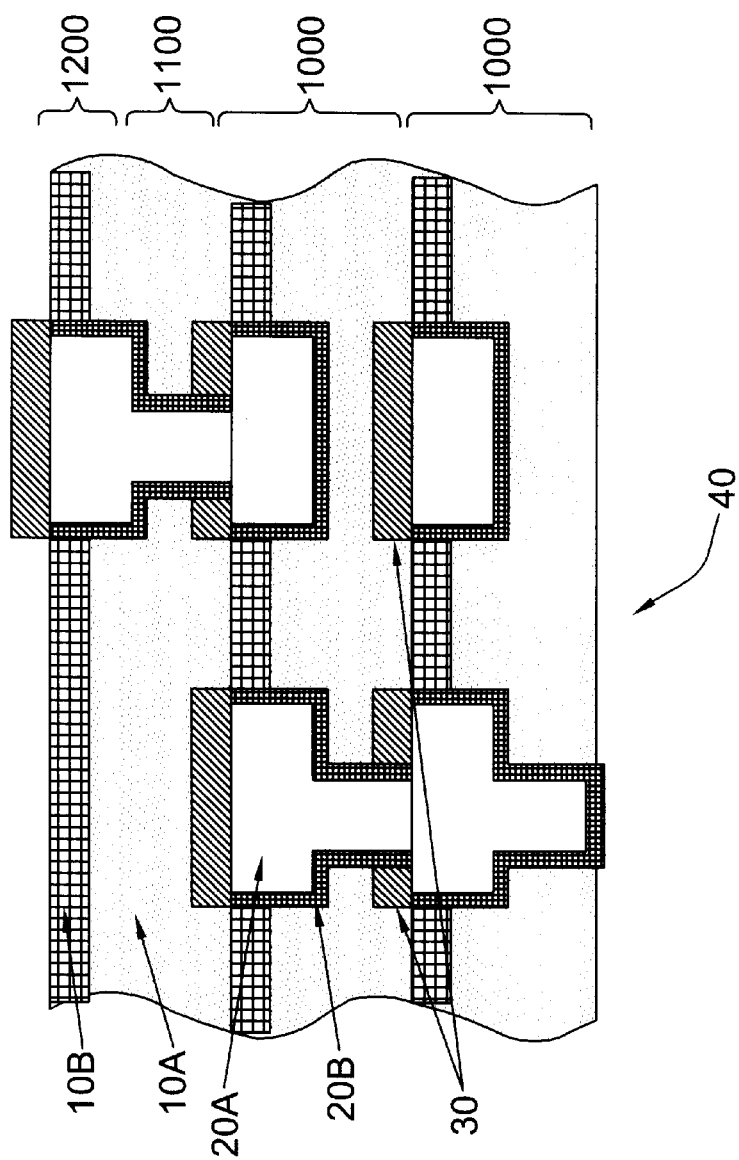
Fig. 8: Cross Sectional View of Semiconductor Device

NONLITHOGRAPHIC METHOD TO PRODUCE MASKS BY SELECTIVE REACTION, ARTICLES PRODUCED, AND COMPOSITION FOR SAME

CROSS REFERENCE TO RELATED APPLICATION

This application is related to the application entitled "Nonlithographic Method to Produce Self-Aligned Mask, Articles Produced by Same and Composition for Same" Ser. No. 10/287,905 by the same inventors as the present invention, filed on the same day as the present application, and assigned to the same assignee as the present application and which is incorporated herein by reference as if fully set forth herein.

FIELD OF THE INVENTION

This invention relates to the production of patterns on a substrate having regions with different compositions or different surface treatment. More particularly, it relates to a method of producing fine patterns on substrates used in, for example, the microelectronics industry on which electronic devices are fabricated. It is also related to devices fabricated in accordance with the methods. The patterns are fabricated accurately and inexpensively without the use of lithography. The present invention also provides many additional advantages, which shall become apparent as described below.

BACKGROUND OF THE INVENTION

A number of applications and technologies involve structures having a well-defined arrangement of chemically distinct components at the surface of a substrate. A common example is a substrate surface having metal conductor regions separated by insulator regions. Normally, these structures are defined by patterning processes such as lithography, embossing, and stamping, and have length scales ranging from 10nanometers to several microns. In many of these systems it may be necessary or highly beneficial to apply an additional component or treatment to only one of the components at the surface. One technique for performing this task is through the use of a mask to protect regions where this additional application or treatment is not desired. Effectively, the mask material directs this treatment to the intended surfaces that are fully exposed. Unfortunately, typical procedures to generate a mask by lithographic or other means can be expensive and error prone. Thus, a method in which these conventional approaches can be circumvented would be highly advantageous.

A particular example in which such strategies would be useful involves integrated circuits comprised of metal and dielectric components. It is widely known that the speed of propagation of interconnect signals is one of the most important factors controlling overall circuit speed as feature sizes are reduced and the number of devices per unit area is increased. Throughout the semiconductor industry, there has been a strong drive to reduce the dielectric constant, k, of the dielectric materials existing between metal lines and/or to minimize the thickness of layers having comparatively larger dielectric constants, e.g., cap barrier layers. Both of these approaches reduce the effective dielectric constant, $k_{eff}$, of the components between metal lines, and as a result, interconnect signals travel faster through conductors due to a reduction in resistance-capacitance (RC) delays. Unfortunately, these strategies are difficult to implement due to limitations in maintaining significant properties, i.e., mechanical, barrier, electrical, etc., that result with a reduction in thickness or change in the chemistry of the layers.

SUMMARY OF THE INVENTION

This invention relates to a method to fabricate mask layers onto a pre-patterned substrate having two or more chemically distinct surface regions. The mask layer is deposited by a selective reaction approach that provides self-alignment of the layers. This method can apply to any technology or application involving a chemically or physically heterogeneous substrate including: interconnect structures for high speed microprocessors, application specific integrated circuits (ASICs), flexible organic semiconductor chips, and memory storage. Other structures that can be fabricated utilizing this method include: displays, circuit boards, chip carriers, microelectromechanical systems (MEMS), chips for hi-thoughput screening, microfabricated fluidic devices, etc. The utility of this method stems from a simple and robust means in which the replication of a patterned substrate to generate a mask layer can be performed, circumventing the requirement for expensive and error prone methods, such as lithography. Thus, the present invention provides an extremely advantageous alternative to the prior art techniques.

In the example of integrated circuits, the effective dielectric constant is reduced by the use of a process wherein layers are selectively placed upon the metal lines. To do this, mask layers are first applied to the dielectric or hard mask surfaces. In accordance with the invention, these layers are generated by mechanisms involving selective chemical reactions as described below. The layers can be self-aligned such that lithographic processes are not required to define the features. Upon self-alignment on the dielectric/hardmask surfaces, these layers, can then be used as a mask for subsequent deposition of other layers which serve as diffusion barriers to copper, oxygen and/or water, layers which reduce the electromigration attributes of the metal lines, and seed layers.

Thus, in the example of integrated circuits, the use of the self-aligned masks allows a simplified fabrication process in which the effective dielectric constant between metal lines can be reduced through selective application of various materials to the metal lines. This is central to maximizing the propagation speed of interconnect signals and ultimately provides faster overall circuit performance. Furthermore, this invention leads to a higher level of protection and reliability of interconnect structures as the errors attributed to conventional patterning methods are eliminated and to reduced processing costs. Although the utilization of the self-aligned masks is described for integrated circuits, this method is useful for any application wherein the modification of a specific component in a pre-patterned substrate is beneficial.

Thus, the invention is directed to a process wherein a mask is applied to a pre-patterned substrate, through selective chemical reactions described below, that replicates the underlining pattern. This mask can then be utilized for treatment or material deposition onto specific components of the pre-patterned substrate. The use of the self-aligned masks allows a unique process in which masks can be generated without the need to perform additional pattern defining steps.

Another application of this invention is its use for semiconductor packaging substrates which are comprised of conductors (usually copper) and insulators (usually epoxy, polyimide, alumina, cordierite glass ceramic and the like) disposed adjacent to each other. Commonly, the conductors must be protected from external ambients and processing exposures such as soldering and wet etching. This protection can be achieved by using the various methods of forming selective coatings on the conductor. Alternately, selective coating on the dielectric by one of the exemplary methods can leave the metal exposed for further processing by methods such as electroless plating to add additional metal layers such as nickel, cobalt, palladium, gold and others on top, without exposing the dielectrics to these process steps. The ability to accomplish these selective modifications without the use of lithographic processing leads to cost reductions and is particularly advantageous in microelectronic packaging, which is very cost sensitive.

Although the utilization of the self-aligned masks is described for microelectronic parts, this method is useful for any application whereby the modification of a specific component in a pre-patterned substrate is beneficial.

Thus, this invention is directed to a method for forming a self aligned pattern on an existing pattern on a substrate comprising applying a coating of the masking material to the substrate; and allowing at least a portion of the masking material to preferentially attach to portions of the existing pattern. The pattern may be comprised of a first set of regions of the substrate having a first atomic composition and a second set of regions of the substrate having a second atomic composition different from the first composition. The first set of regions may include one or more metal elements and the second set of regions may include a dielectric. The first regions may comprise copper and may be patterned electrical interconnects.

According to the present invention, the masking material may comprise a polymer containing a reactive grafting site that selectively binds to the portions of the pattern. The polymer may be that of an amorphous polymeric system having chain architecture (including linear, networked, branched and dendrimeric) and may contain one or more monomeric units. The polymer may be selected from the group consisting of polystyrenes, polymethacrylates, polyacrylates, and polyesters, as well as others mentioned below. The polymer may have a reactive functional group serving as the grafting site, the functional group being selected from the group consisting of: acyl chlorides, anhydrides, hydroxys, esters, ethers, aldehydes, ketones, carbonates, acids, epoxies, aziridines, phenols, amines, amides, imides, isocyanates, thiols, sulfones, halides, phosphines, phosphine oxides, nitros, azos, benzophenones, acetals, ketals, diketones, and organosilanes ($Si_xL_yR_z$) where L is selected from the group consisting of hydroxy, methoxy, ethoxy, acetoxy, alkoxy, carboxy, amines, halogens, R is selected from the group consisting of hydrido, methyl, ethyl, vinyl, phenyl (any alkyl or aryl).

The method may further comprise preparing a polymer to act as the masking material, forming a condensed phase containing the polymer, and contacting the portions of the pattern with the condensed phase. The condensed phase may be a liquid. The liquid may be a solvent for the polymer.

In accordance with another aspect of the invention, the masking material may include a reactive molecule that binds to the portions of the pattern to provide a layer of functional groups suitable for polymerization initiation. The layer may be a molecular monolayer. The reactive molecule may include a first moiety that binds to the portions of the pattern and a second moiety that serves as a polymerization initiator. The first moiety that binds to the portions of the pattern may be selected from the group consisting of acyl chlorides, anhydrides, hydroxys, esters, ethers, aldehydes, ketones, carbonates, acids, epoxies, aziridines, phenols, amines, amides, imides, isocyanates, thiols, sulfones, halides, phosphines, phosphine oxides, nitros, azos, benzophenones, acetals, ketals, diketones, and organosilanes ($Si_xL_yR_z$) where L is selected from the group consisting of hydroxy, methoxy, ethoxy, acetoxy, alkoxy, carboxy, amines, halogens, R is selected from the group consisting of hydrido, methyl, ethyl, vinyl, phenyl (any alkyl or aryl). The second moiety that serves as a polymerization initiator may be selected from the group consisting of peroxides, nitroxides, halides, azos, peresters, thioesters, hydroxy; metal organics having the stoichiometry of RX where R may consist of: benzyl, cumyl, butyl, alkyl, napthalene, and X may consist of sodium, lithium, and potassium; protonic acids, lewis acids, carbenium salts, tosylates, triflates, benzophenones, aryldiazonium, diaryliodonium, triarylsulfonium, acetals, ketals, and diketones.

The method may comprise applying a reactive monomer to the layer of functional groups, so that the reactive monomer polymerizes on the layer to form a self-aligned mask layer. The polymerization may comprise a chain growth mechanism wherein polymerization proceeds through addition of a monomer to a reactive polymer. The reactive monomer may be any molecule that polymerizes by a chain growth process and may be a substituted ethylenic organic molecule, one of a monomeric ring, a mixture of similar or dissimilar molecules that react with each other to form a covalent bond, and may be oligomeric or polymeric. The reactive monomer may be one that polymerizes when exposed to one of a free radical, an anion, transition metal catalyst, or a cation. The reactive monomer may also be one that polymerizes when exposed to thermal annealing or irradiation. The reactive monomer may be selected from the group consisting of: dienes, alkenes, acrylics, methacrylics, acrylamides, methacrylamides, vinylethers, vinyl alcohols, ketones, acetals, vinylesters, vinylhalides, vinylnitriles, styrenes, vinyl pyridines, vinyl pyrrolidones, vinyl imidazoles, vinylheterocyclics, styrene, cyclic lactams, cyclic ethers, cyclic lactones, cycloalkenes, cyclic thioesters, cyclic thioethers, aziridines, phosphozines, siloxanes, oxazolines, oxazines, and thiiranes.

The method may further comprise applying the reactive monomer in a condensed phase, and contacting the portions of the pattern with the condensed phase. The condensed phase may be a liquid. The liquid may be a solvent for the polymer. Alternatively, the method may further comprise applying the reactive monomer in a vapor phase.

In accordance with another aspect of the invention, the masking material may include a reactive molecule having functional groups suitable for polymerization propagation. The reactive molecule may be comprised of a first moiety that will bind the reactive molecule to the portions of the existing pattern, and a second moiety that serves as a monomeric unit. The first moiety may be selected from the group consisting of: acyl chlorides, anhydrides, hydroxys, esters, ethers, aldehydes, ketones, carbonates, acids, epoxies, aziridines, phenols, amines, amides, imides, isocyanates, thiols, sulfones, halides, phosphines, phosphine oxides, nitros, azos, benzophenones, acetals, ketals, diketones, and organosilanes ($Si_xL_yR_z$) where L is selected from the group consisting of hydroxy, methoxy, ethoxy, acetoxy, alkoxy, carboxy, amines, halogens, R is selected from the group consisting of hydrido, methyl, ethyl, vinyl, phenyl (any alkyl or aryl). The second moiety may be comprised of a monomer, and may be selected from the group consisting of, dienes, alkenes, acrylics, methacrylics, acrylamides, methacrylamides, vinylethers, vinyl alcohols, ketones, acetals, vinylesters, vinylhalides, vinylnitriles, styrenes, vinyl pyridines, vinyl pyrrolidones, vinyl imidazoles, vinylheterocyclics, styrene, cyclic lactams, cyclic ethers, cyclic lactones, cycloalkenes, cyclic thioesters, cyclic thioethers, aziridines, phosphozines, siloxanes, oxazolines, oxazines, and thiiranes, The reactive monomer polymerizes when exposed to one of a free radical, an anion, a transition metal catalyst, or a cation. The reactive monomer may be one that polymerizes when exposed to thermal annealing or irradiation. The polymerization of the reactive monomer with the second moiety of the reactive molecule, which serves as a monomeric unit, provides a mechanism where polymerization through the surface bound groups occurs to form a self-aligned mask layer. The reactive monomer may be any monomer that polymerizes by a chain growth process and may be selected from the group consisting of dienes, alkenes, acrylics, methacrylics, acrylamides, methacrylamides, vinylethers, vinyl alcohols, ketones, acetals, vinylesters, vinylhalides, vinylnitriles, styrenes, vinyl pyridines, vinyl pyrrolidones, vinyl imidazoles, vinylheterocyclics, styrene, cyclic lactams, cyclic ethers, cyclic lactones, cycloalkenes, cyclic thioesters, cyclic thioethers, aziridines, phosphozines, siloxanes, oxazolines, oxazines, and thiiranes.

The addition of initiator can be utilized for polymerization or the polymerization can be driven thermally. The initiator may be selected from the group consisting of peroxides, nitroxides, halides, azos, peresters, thioesters, hydroxy; metal organics having the stoichiometry of RX where R may consist of: benzyl, cumyl, butyl, alkyl, napthalene, and X may consist of sodium, lithium, and potassium; protonic acids, lewis acids, carbenium salts, tosylates, triflates, benzophenones, aryldiazonium, diaryliodonium, triarylsulfonium, acetals, ketals, and diketones.

The method may further comprise applying the reactive monomer and initiator in a condensed phase, and contacting the portions of the pattern with the condensed phase. The condensed phase may be a liquid. The liquid may be a solvent for the polymer. Alternatively, a vapor phase may be used.

In accordance with another aspect of the invention, the masking material includes a composition wherein polymerization proceeds by a step growth process whereby reactions that combine monomers and polymers having two or more functionalities that react with each other to produce polymers of a larger molecular weight. The masking material comprises a reactive molecule, wherein reaction of the reactive molecule with the portion of the pattern generates a layer having reactive groups, which participate in step growth polymerization. The reactive molecule comprises a first moiety that binds the reactive molecule to the portions of the pattern, and a second moiety that serves as a reaction site. The first moiety that binds to portions of the pattern may be selected from the group consisting of: acyl chlorides, anhydrides, hydroxys, esters, ethers, aldehydes, ketones, carbonates, acids, epoxies, aziridines, phenols, amines, amides, imides, isocyanates, thiols, sulfones, halides, phosphines, phosphine oxides, nitros, azos, benzophenones, acetals, ketals, diketones, and organosilanes ($Si_xL_yR_z$) where L is selected from the group consisting of hydroxy, methoxy, ethoxy, acetoxy, alkoxy, carboxy, amines, halogens, R is selected from the group consisting of hydrido, methyl, ethyl, vinyl, phenyl (any alkyl or aryl),hydroxy. The second moiety that serves as a reaction site may be selected from the group consisting of: amines, nitriles, alcohols, carboxylic acids, sulfonic acids, isocyanates, acyl chlorides, esters, amides, anhydrides, epoxies, halides, acetoxy, vinyl, and silanols. The method further comprises applying a reactive monomer, having one or more functionalities to the layer a form a self-aligned mask layer. The one or more functionalities react with each other to form a covalent bond. The reactive monomer may be one that polymerizes when exposed to thermal annealing or irradiation.

The reactive monomer may be comprised of at least two functional groups which may be dissimilar and may be a mixture of dissimilar molecules and may be comprised of functional groups consisting of: amines, nitriles, alcohols, carboxylic acids, sulfonic acids, isocyanates, acyl chlorides, esters, amides, anhydrides, epoxies, halides, acetoxy, vinyl, and silanols.

The method may further comprise applying the reactive monomer in a condensed phase, and contacting the portions of the pattern with the condensed phase. The condensed phase may be a liquid. The liquid may be a solvent for the polymer. Alternatively, a vapor phase may be used. In general, a vapor phase is used only when applying the reactive monomer to functional groups, and not when polymer is applied.

The method may further comprise removing the masking material from portions of the pattern to which it does not attach. The removing may be accomplished by at least one of rinsing, ultrasonication, dissolution, thermolysis, irradiation, decomposition and related removal methods known in the art. Application of the masking material to the substrate may be accomplished by any means known in the art for example: spin-coating, dip coating, spray coating, scan coating, and using a doctor blade. Other methods may be used within the invention.

The method may further comprise chemically treating regions of the substrate prior to applying the coating. The chemically treating may be comprised of at least one of plasma treatment, application of an oxidizing solution, annealing in an oxidizing or reducing atmosphere, and application of a material that renders surface portions of the substrate, to which it is applied, hydrophobic. The chemical treatment changes the wetting characteristics of the regions of the substrate. The chemically treating may comprise applying a molecule having reactive grafting sites that can covalently bind to the dielectric surface including: acyl chlorides, anhydrides, hydroxys, esters, ethers, aldehydes, ketones, carbonates, acids, epoxies, aziridines, phenols, amines, amides, imides, isocyanates, thiols, sulfones, halides, phosphines, phosphine oxides, nitros, azos, benzophenones, acetals, ketals, diketones, and organosilanes ($Si_xL_yR_z$) where L is selected from the group consisting of hydroxy, methoxy, ethoxy, acetoxy, alkoxy, carboxy, amines, halogens, R is selected from the group consisting of hydrido, methyl, ethyl, vinyl, and phenyl (any alkyl or aryl). The method may further comprise chemically treating regions of the substrate prior to the coating with chemicals that have an affinity to metals. The include chemicals, such as copper binding groups having functional groups comprised of hydroxys, esters, ethers, aldehydes, ketones, carbonates, acids, phenols, amines, amides, imides, thioesters, thioethers, ureas, urethanes, nitriles, isocyanates, thiols, sulfones, halides, phosphines, phosphine oxides, phosphonimides, nitros, azos, thioesters, and thioethers. The functional groups can be heterocyclics, such as benzotriazole, pyridines, imidazoles, imides, oxazoles, benzoxazoles, thiazoles, pyrazoles, triazoles, thiophenes, oxadiazoles, thiazines, thiazoles, quionoxalines, benzimidazoles, oxindoles, and indolines.

The invention is also directed to a structure comprising a self aligned pattern on an existing pattern on a substrate, the self aligned pattern including a masking material having an affinity for portions of the existing pattern, so that the masking material preferentially reactively grafts to the portions of the existing pattern. The pattern may be comprised of a first set of regions of the substrate having a first atomic composition and a second set of regions of the substrate having a second atomic composition different from the first composition. The first set of regions may include one or more metal elements and the second set of regions may include a dielectric. The self-aligned pattern is disposed upon the second set of regions or only upon the second set of regions; that is not upon the first set of regions. The structure may comprise at least one conductive feature, formed on the substrate, with the substrate further comprising at least one insulating layer surrounding the conductive feature. The insulating layer may surround the at least one conductive feature at its bottom and lateral surfaces. The structure may further comprise at least one conductive barrier layer disposed at, at least one interface between the insulating layer and the at least one conductive feature. The combination of the at least one conductive feature and the insulating layers, may be repeated to form a multilevel interconnect stack.

The substrate may be one of a silicon wafer containing microelectronic devices, a ceramic chip carrier, an organic chip carrier, a glass substrate, a gallium arsenide substrate, a silicon carbide substrate, or other semiconductor wafer, a circuit board, or a plastic substrate.

The invention is also directed to a composition for selectively coating a pattern on a substrate, the composition comprising a carrier material for application to the substrate, and a polymer in the carrier that reactively grafts to regions of the substrate having first chemical characteristics. The polymer may be amorphous, may having any chain architecture (including linear, networked, branched, dendrimeric), and can contain one or more monomeric units. The polymer may have acyclic main chains (carbon containing backbones) and may include poly(dienes), poly(alkenes), poly(acrylics), poly(methacrylics), poly(acrylamides), poly(methacrylamides), poly(vinylethers), poly(vinyl alcohols), poly(ketones), poly(acetals), poly(vinylesters), poly(vinylhalides), poly(vinylnitriles), poly(styrenes), poly(vinyl pyridines), poly(vinyl pyrrolidones), poly(vinyl imidazoles), and poly(vinylheterocyclics). If the polymer has a carbocyclic main chain, it may be, for example, a poly(phenylene). The polymer may also be a main chain acyclic heteroatom polymer selected from the group of poly(oxides), poly(carbonates), poly(esters), poly(anhydrides), poly(urethanes), poly(sulfonates), poly(siloxanes), poly(sulfides), poly(thioethers), poly(thioesters), poly(sulfones), poly(sufonamides), poly(amides), poly(imines), poly(ureas), poly(phosphazenes), poly(silanes), poly(siloxanes), poly(silazanes), and poly(nitriles). The polymer may have a heterocyclic main chain and may be selected from the group of poly(imides), poly(oxazoles), poly(benzoxazoles), poly(thiazoles), poly(pyrazoles), poly(triazoles), poly(thiophenes), poly(oxadiazoles), poly(thiazines), poly(thiazoles), poly(quionoxalines), poly(benzimidazoles), poly(oxindoles), poly(indolines), poly(pyridines) poly(triazines), poly(piperazines), poly(pyridines), poly(piperdines), poly(pyrrolidines), poly(carboranes), poly(fluoresceins), poly(acetals), and poly(anhydrides).

The polymer in the carrier may have reactive functional groups that covalently bond to regions of the substrate having first chemical characteristics.

Other and further objects, advantages and features of the present invention will be understood by reference to the following specification in conjunction with the annexed drawings, wherein like parts have been given like numbers.

BRIEF DESCRIPTION OF THE DRAWINGS

FIG. 1 is a general process flow chart for self aligned mask generation by covalent polymer attachment, in accordance with the invention.

FIG. 2 illustrates a first method for self aligned mask generation by polymer reaction, in accordance with the invention.

FIG. 3 is a general process flow chart for self aligned mask generation by surface polymerization, in accordance with the invention.

FIG. 4 is a second method for self aligned mask generation by chain polymerization from a surface grafted initiator, in accordance with the invention.

FIG. 5 is a third method for self aligned mask generation by chain polymerization from a surface grafted monomer, in accordance with the invention.

FIG. 6 is a fourth method for self-aligned mask generation by step polymerization from a surface grafted reactive site, in accordance with the invention.

FIG. 7 is a cross sectional view of a semiconductor device in accordance with the invention.

FIG. 8 is a cross sectional view of another semiconductor device in accordance with the invention.

DESCRIPTION OF THE PREFERRED EMBODIMENTS

In accordance with the invention, a patterned substrate containing structures having two or more distinct components is processed by a route whereby layers can be applied to selected component surfaces. This layer can be generated by a number of approaches involving selective reactions described below and can be used as a mask layer for subsequent treatment or material deposition onto the intended component surfaces. These structures can be sacrificial and do not generally remain in the final structure. The use of the masks for the generation of self assembled barrier layers can proceed by a number of routes including: blanket deposition followed by lift-off, blanket deposition followed by chemical mechanical polishing (CMP), and enhancement of selective electrochemical and electroless metal deposition processes. It will be clear to one skilled in the art that the application of a self-aligned layer by any of the approaches described below can be used as a process to generate a selective mask.

Two general approaches exist for the self-aligned mask generation. The preferred embodiment of the patterned substrate is an interconnect structure having metal 20 and dielectric surfaces 10, as described below.

Referring to FIGS. 1 and 2, the process flow and process for a first method, in accordance with the invention, for pattern self-replication are illustrated, respectively. A polymer containing at least one reactive grafting site is prepared at step 2, generally in a carrier such as a solvent. The reactive grafting site is a functional group that forms at least one covalent bond with the dielectric surface. In some cases, the surface of the patterned substrate may be modified, at step 3, to enhance preferential surface reaction in some regions of the patterned substrate. At step 4, the polymer 100, which contains a reactive grafting site A, that selectively binds to the dielectric surface 10 through the formation of at least one covalent bond is spin coated or applied by any suitable coating method to the substrate containing the patterned substrate. Either upon contact or with appropriate treatment, e.g., thermal annealing or inducing reaction by radiation, as at step 5, the polymer 100 containing the reactive grafting site A reacts or interacts favorably with the intended surface. Removal of the material at step 6, e.g., rinsing with solvent, can then be performed to remove unbound material that may be remaining on the metal surface 20 resulting in a self-aligned mask layer located solely on the dielectric surface 10.

Optionally, the surface characteristics of one or more of the exposed surfaces can be chemically modified prior to application of the self-aligned mask layer to facilitate each of the methods described above in step 3. Either the dielectric surface 10 or the metal surface 20 can be modified in this step. Chemical modification can be performed with any combination of modification schemes including: plasma treatment, application of an oxidizing or reducing solution, annealing in a reducing or oxidizing atmosphere, and application of a material that renders surface portions of the substrate, to which it is applied, to be hydrophobic or hydrophilic. Specific chemical treatments directed to the dielectric surface 10 may include applying an organosilane comprised of $Si_xL_yR_z$, where L is selected from the group consisting of hydroxy, methoxy, ethoxy, acetoxy, alkoxy, carboxy, amines, halogens, R is selected from the group consisting of hydrido, methyl, ethyl, vinyl, and phenyl (any alkyl or aryl). Specific chemical treatments directed to the metal surface 20 may include applying molecules that have preferential interactions with the metal surface including molecules having the following functional groups: hydroxys, esters, ethers, aldehydes, ketones, carbonates, acids, phenols, amines, amides, imides, thioesters, thioethers, ureas, urethanes, nitriles, isocyanates, thiols, sulfones, halides, phosphines, phosphine oxides, phosphonimides, nitros, azos, thioesters, thioethers, benzotriazole, pyridines, imidazoles, imides, oxazoles, benzoxazoles, thiazoles, pyrazoles, triazoles, thiophenes, oxadiazoles, thiazines, thiazoles, quionoxalines, benzimidazoles, oxindoles, indolines, nitrogenous compounds, ans phosphoric acids.

In this first method, the polymer 100 containing a reactive grafting site A can be amorphous, may have any chain architecture (including linear, networked, branched, dendrimeric), and can contain one or more monomeric units. The polymer may have acyclic main chains (carbon containing backbones) and may include poly(dienes), poly(alkenes), poly(acrylics), poly(methacrylics), poly(acrylamides), poly(methacrylamides), poly(vinylethers), poly(vinyl alcohols), poly(ketones), poly(acetals), poly(vinylesters), poly(vinylhalides), poly(vinylnitriles), poly(styrenes), poly(vinyl pyridines), poly(vinyl pyrrolidones), poly(vinyl imidazoles), and poly(vinylheterocyclics). If the polymer has a carbocyclic main chain, it may be, for example, a poly(phenylene). The polymer may also be a main chain acyclic heteroatom polymer selected from the group of poly(oxides), poly(carbonates), poly(esters), poly(anhydrides), poly(urethanes), poly(sulfonates), poly(siloxanes), poly(sulfides), poly(thioethers), poly(thioesters), poly(sulfones), poly(sufonamides), poly(amides), poly(imines), poly(ureas), poly(phosphazenes), poly(silanes), poly(siloxanes), poly(silazanes), and poly(nitriles). The polymer may have a heterocyclic main chain and may be selected from the group of poly(imides), poly(oxazoles), poly(benzoxazoles), poly(thiazoles), poly(pyrazoles), poly(triazoles), poly(thiophenes), poly(oxadiazoles), poly(thiazines), poly(thiazoles), poly(quionoxalines), poly(benzimidazoles), poly(oxindoles), poly(indolines), poly(pyridines) poly(triazines), poly(piperazines), poly(pyridines), poly(piperdines), poly(pyrrolidines), poly(carboranes), poly(fluoresceins), poly(acetals), and poly(anhydrides).

The materials are designed with reactive functional groups A, or reactive grafting sites which may be selected from the group consisting : acyl chlorides, anhydrides, hydroxys, esters, ethers, aldehydes, ketones, carbonates, acids, epoxies, aziridines, phenols, amines, amides, imides, isocyanates, thiols, sulfones, halides, phosphines, phosphine oxides, nitros, azos, benzophenones, acetals, ketals, diketones, and organosilanes ($Si_xL_yR_z$) where L is selected from the group consisting of hydroxy, methoxy, ethoxy, acetoxy, alkoxy, carboxy, amines, halogens, R is selected from the group consisting of hydrido, methyl, ethyl, vinyl, and phenyl (any alkyl or aryl), that covalently bind to the dielectric surface 10. These film structures can then be used as a mask for further processing as described previously.

Referring to FIG. 3, the process flow for the second, third, and fourth methods for pattern self-replication, in accordance with the invention, is illustrated. Also referring to FIGS. 4–6, but first to FIG. 3, the second, third, and fourth methods use a material that selectively reacts with the dielectric surface 10 and is subsequently used to generate a mask layer through polymerization of a monomer or telomer system. Optionally, the chemical modification of either the dielectric surface 10 or metal surface 20, as described previously, can be first performed at step 11. This method involves, at step 12, a covalent anchoring of a reactive molecule onto the dielectric surface 10 followed by a reaction, at step 14, with a polymerizable group (monomer, macromonmer, telomer) to generate a self aligned mask layer 500. Optional steps include rinsing with a solvent 13 between steps 12 and 14, exposure to heat or radiation at step 15, and rinsing with a solvent at step 16, as more fully described below.

Both the second and third methods involve a chain growth mechanism wherein polymerization proceeds primarily through addition of monomer to a reactive polymer. For either of these methods, the chemical modification of either the dielectric surface 10 or metal surface 20, as described previously, can be first performed.

Referring to FIG. 4, the second method involves polymerization from a substrate grafted initiator. If the reactive molecule has a moiety that can serve as a polymerization initiator I, attachment of the reactive molecule to the dielectric surface 10 generates a layer having functional groups suitable for polymerization initiation 200. Application of reactive monomer to the layer having functional groups suitable for polymerization initiation 200 results in a self aligned mask layer 500 through polymerization from the surface.

For the second method, the reactive molecule is comprised of a first moiety that will bind the reactive molecule to the dielectric surface 10 and a second moiety that will serve as a polymerization initiator. The first moiety allowing covalent bonding to the dielectric surface may include reactive grafting sites, selected from the group including acyl chlorides, anhydrides, hydroxys, esters, ethers, aldehydes, ketones, carbonates, acids, epoxies, aziridines, phenols, amines, amides, imides, isocyanates, thiols, sulfones, halides, phosphines, phosphine oxides, nitros, azos, benzophenones, acetals, ketals, diketones, and organosilanes ($Si_xL_yR_z$) where L is selected from the group consisting of hydroxy, methoxy, ethoxy, acetoxy, alkoxy, carboxy, amines, halogens, R is selected from the group consisting of hydrido, methyl, ethyl, vinyl, and phenyl (any alkyl or aryl). The second moiety serving as a polymerization initiator may include, peroxides, nitroxides, halides, azos, peresters, thioesters, hydroxy; metal organics having the stoichiometry of RX where R may consist of: benzyl, cumyl, butyl, alkyl, napthalene, and X may consist of sodium, lithium, and potassium; protonic acids, lewis acids, carbenium salts, tosylates, triflates, benzophenones, aryldiazonium, diaryliodonium, triarylsulfonium, acetals, ketals, and diketones. The reactive monomer can be any substituted ethylenic organic molecule or monomeric ring that polymerizes under a number of conditions (free radical, anionic, cationic, etc.) and can include: dienes, alkenes, acrylics, methacrylics, acrylamides, methacrylamides, vinylethers, vinyl alcohols, ketones, acetals, vinylesters, vinylhalides, vinylnitriles, styrenes, vinyl pyridines, vinyl pyrrolidones, vinyl imidazoles, vinylheterocyclics, styrene, cyclic lactams, cyclic ethers, cyclic lactones, cycloalkenes, cyclic thioesters, cyclic thioethers, aziridines, phosphozines, siloxanes, oxazolines, oxazines, and thiiranes.

Referring to FIG. 5, a third method, in accordance with the invention, involves polymerization from a substrate grafted monomer. If the reactive molecule is a moiety that can serve as a polymerizable monomer M, attachment of the reactive molecule to the dielectric surface 10 generates a layer 300 having functional groups suitable for polymerization propagation. Application of a reactive monomer to the layer having functional groups suitable for polymerization propagation 300 results in a self aligned mask layer 500 through polymerization from the surface.

For the third method, in accordance with the invention, the reactive molecule is comprised of a first moiety that will bind the reactive molecule to the dielectric surface 10 and a second moiety that will serve as a monomeric unit. The first moiety allowing covalent bonding to the dielectric surface can include reactive grafting sites such as acyl chlorides, anhydrides, hydroxys, esters, ethers, aldehydes, ketones, carbonates, acids, epoxies, aziridines, phenols, amines, amides, imides, isocyanates, thiols, sulfones, halides, phosphines, phosphine oxides, nitros, azos, benzophenones, acetals, ketals, diketones, and organosilanes ($Si_xL_yR_z$) where L is selected from the group consisting of hydroxy, methoxy, ethoxy, acetoxy, alkoxy, carboxy, amines, halogens, R is selected from the group consisting of hydrido, methyl, ethyl, and vinyl, phenyl (any alkyl or aryl). The second moiety serving as a monomeric unit can include, dienes, alkenes, acrylics, methacrylics, acrylamides, methacrylamides, vinylethers, vinyl alcohols, ketones, acetals, vinylesters, vinylhalides, vinylnitriles, styrenes, vinyl pyridines, vinyl pyrrolidones, vinyl imidazoles, vinylheterocyclics, styrene, cyclic lactams, cyclic ethers, cyclic lactones, cycloalkenes, cyclic thioesters, cyclic thioethers, aziridines, phosphozines, siloxanes, oxazolines, oxazines, and thiiranes. The reactive monomer can be any vinyl or monomeric ring as described for the second method.

Referring to FIG. 6, a fourth method, in accordance with the invention, involves a step growth mechanism, whereby polymerization proceeds by reactions that combine monomers and polymers having two or more functionalities that react with each other to produce polymers of larger molecular weight. For this method, the chemical modification of either the dielectric surface 10 or metal surface 20, as described previously, can be first performed. This approach, as shown in FIG. 6, utilizes a polymerization scheme where the reactive molecule, having a functional group R, is applied to the patterned substrate. Selective reaction of the reactive molecule to the dielectric surfaces 10 generates a layer 400 having reactive groups, which can participate in step growth polymerizations. Application of reactive monomers, having either one or more S and/or T functionalities that react with each other to form a covalent bond, to the layer having reactive groups 400, results in the formation of a self aligned mask layer 500.

For the fourth method, the masking material is comprised of a first moiety that will bind the reactive molecule to the dielectric surface 10 and a second moiety that will serve as a reaction site. The first moiety allowing covalent bonding to the dielectric surface can include, organosilanes, hydroxy, acyl chlorides, carboxylic acids acyl chlorides, anhydrides, hydroxys, esters, ethers, aldehydes, ketones, carbonates, acids, epoxies, aziridines, phenols, amines, amides, imides, isocyanates, thiols, sulfones, halides, phosphines, phosphine oxides, nitros, azos, benzophenones, acetals, ketals, diketones, and organosilanes ($Si_xL_yR_z$) where L is selected from the group consisting of hydroxy, methoxy, ethoxy, acetoxy, alkoxy, carboxy, amines, halogens, R is selected from the group consisting of hydrido, methyl, ethyl, vinyl, and phenyl (any alkyl or aryl). The second moiety serving as a monomeric unit can include, amines, nitriles, alcohols, carboxylic acids, sulfonic acids, isocyanates, acyl chlorides, esters, amides, anhydrides, epoxies, halides, acetoxy, vinyl, and silanols. Monomers used for this approach are molecules having two or more chemically identical or dissimilar functional groups that undergo step growth polymerization. The functional groups can include: amines, nitriles, alcohols, carboxylic acids, sulfonic acids, isocyanates, acyl chlorides, esters, amides, anhydrides, epoxies, halides, acetoxy, vinyl, and silanols.

USE OF THE ABOVE METHODS IN FABRICATING IC CHIPS, CHIP CARRIERS AND CIRCUIT BOARDS

Several derived structures can be fabricated using the selective masking methods described above. In these examples, the pre-existence of a substrate containing a pattern, the pattern comprised of a first set of regions of the substrate surface having a first atomic composition including one or more metal elements and having a second set of regions of the substrate surface being a dielectric and having a second atomic composition different from the first composition, is presumed. Selective blocking of the dielectric surface is achieved first by one of the methods described above. The first set of regions or areas which comprises one or metal elements is exposed and is then subjected to processing steps such as electroless deposition alone, or electoless deposition of metal, metal or dielectric deposition by sputtering, evaporation, chemical vapor deposition (CVD), plasma enhanced chemical vapor deposition (PECVD) and the like, followed by an optional planarization step to form added layers only on the first set of regions.

The structure which is produced is a microelectronic interconnect structure comprising at least one conductive feature with a selective cap on its top surface, formed on a substrate, with the substrate further comprising at least one insulating layer surrounding the conductive feature at its bottom and lateral surfaces, and one or more optional conductive barrier layers disposed at one or more of the interfaces between the insulator and the conductive feature.

Examples of this structural embodiment include, but are not limited to, electrically conductive interconnect wiring which is capped and embedded in a device chip interconnect stack containing insulators, conducting and insulating barrier layers and the like; interconnect wiring of metals disposed on a ceramic chip carrier package; and interconnect wiring disposed on and within an organic chip or device carrier such as a printed circuit board; and thin film wiring arrays on a glass or polymeric substrate used in the fabrication of information displays and related hand held devices.

Referring to FIG. 7, an interconnect structure 30 having an interlayer dielectric 31, metal wiring 32, , liner barrier layer 34, and cap barrier layer 36 is illustrated. The interconnect structure has multiple levels 1000 comprised of via 1100 and line 1200 levels. The preferred materials for the interlayer dielectric 31 have low dielectric constants (k<3) and include: carbon-doped silicon dioxide (also known as silicon oxycarbide or SiCOH dielectrics); fluorine-doped silicon oxide (also known as fluorosilicate glass, or FSG); spin-on glasses; silsesquioxanes, including hydrogen silsesquioxane (HSSQ), methyl silsesquioxane (MSSQ) and mixtures or copolymers of HSSQ and MSSQ; and any silicon-containing low-k dielectric. As would be known in the art, this interlayer dielectric may contain pores to further reduce the dielectric constant, and other dielectrics may be used.

Referring to FIG. 8, an interconnect structure 40 having an interlayer dielectric 31, dielectric hardmask 41, metal wiring 32, , liner barrier layer 34, and cap barrier layer 36 is illustrated. The interconnect structure has multiple levels 1000 comprised of via 1100 and line 1200 levels. The preferred materials for the interlayer dielectric 31 have low dielectric constants (k<3), may be an organic polymer thermoset, and may be selected from the group SiLK™, (a product of Dow Chemical Co. ), Flare™ (a product of Honeywell), and other polyarylene ethers . As would be known in the art, this organic polymer dielectric may contain pores to further reduce the dielectric constant, and other organic polymer thermoset dielectrics may be used. The preferred materials for the dielectric hardmask 41 include: silicon carbides, carbon-doped silicon dioxide (also known as silicon oxycarbide or SiCOH dielectrics); fluorine-doped silicon oxide (also known as fluorosilicate glass, or FSG); spin-on glasses; silsesquioxanes, including hydrogen silsesquioxane (HSQ), methyl silsesquioxane (MSQ) and mixtures or copolymers of HSQ and MSQ; and any silicon-containing dielectric.

Applications of the inventive methods to form selective cap barrier layers 36 on patterned metal interconnects are now described in reference to the structures shown in FIGS. 7 and 8 which may be produced using any of the methods described herein. The structures may be generated through a series of steps known in the art involving photolithography; dielectric deposition by spin coating or chemical vapor deposition; metal deposition by electroplating, electoless plating, thermal evaporation, sputtering; planarization by chemical mechanical polishing; wet and dry etch processes such as reactive ion etching; thermal anneals; wet and dry cleans, etc. The example given includes specific details, but it is evident that numerous alternatives, modifications and variations will be apparent to those skilled in the art in light of the methods descriptions given above. Various materials may form the selective cap (such as silicon nitride, or various refractory metals and compounds of said metals). Further, this invention is not limited to constructions of any particular shape or composition.

The application of the methods described herein may be utilized after chemical mechanical polishing steps that result in a patterned top surface as shown in FIGS. 2, 4, 5, and 6. A preferred route to produce a self aligned mask may be to apply polystyrene (PS) having silanol reactive groups, from a toluene solution that would be applied to the patterned surface as shown in FIG. 2 by spin coating. The silanol groups would then covalently bind to the dielectric surfaces with thermal annealing when the wafer is placed on a hot plate at a temperature of about 150° C. for 1 to 5 minutes, in an inert ($N_2$) atmosphere. Removal of unbound PS, by rinsing with toluene, from the metal regions generates a topography, with PS remaining on the dielectric regions.

In the next step, this polystyrene is used as the self aligned mask. A bilayer of tantalum nitride (TaN) and tantalum is then deposited by sputtering in a sputter deposition tool (known in the art) on the patterned substrate containing the self aligned mask. The TaN/Ta bilayer contacts the metal regions and conformally coats the PS. The wafer is then placed in a chemical mechanical polishing (CMP) tool and the bilayer is removed from the polystyrene, and is left intact on the metal regions. Removal of the remaining polystyrene is then performed using thermal degradation by heating in an inert ambient containing<10 ppm $O_2$ or $H_2O$ at a temperature of 400° C. for 30 minutes, to leave the selective cap barrier layer 36 comprised of TaN and Ta only on the metal regions.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications which come within the scope of the appended claims.

What is claimed is:

1. A structure comprising:
  a self aligned pattern on a chemically heterogeneous substrate having an existing pattern, said self aligned pattern including a masking material having an affinity for portions of said existing pattern, so that said masking material preferentially reactively grafts to said portions of said existing pattern wherein said existing pattern on said heterogeneous substrate is comprised of a first set of regions of the substrate having a first atomic composition and a second set of regions of the substrate having a second atomic composition different from the first composition.

2. The structure of claim 1, wherein said first set of regions includes one or more metal elements and wherein said second set of regions includes a dielectric.

3. The structure of claim 2, wherein said self-aligned pattern is disposed upon said second set of regions.

4. The structure of claim 2, wherein said self-aligned pattern is disposed only upon said second set of regions.

5. The structure of claim 2, wherein said self-aligned pattern is not disposed upon said first set of regions.

6. The structure according to claim 1, comprising at least one conductive feature, formed on said substrate, with the substrate further comprising at least one insulating layer surrounding said conductive feature.

7. The structure according to claim 6, wherein said insulating layer surrounds said at least one conductive feature at its bottom and lateral surfaces.

8. The structure according to claim 6, further comprising at least one conductive barrier layer disposed at, at least one interface between said insulating layer and said at least one conductive feature.

9. A structure according to claim 6, where the combination of the at least one conductive feature and the insulating layers, is repeated to form a multilevel interconnect stack.

10. The structure according to claim 9, further comprising at least one conductive barrier layer disposed at, at least one interface between said insulating layer and said at least one conductive feature.

11. The structure according to claim 1, wherein said substrate is one of a microelectronic device chip, a ceramic chip carrier, and an organic chip carrier.

* * * * *